United States Patent
Joshi et al.

(10) Patent No.: US 11,067,343 B2
(45) Date of Patent: Jul. 20, 2021

(54) THERMAL COMPENSATION LAYERS WITH CORE-SHELL PHASE CHANGE PARTICLES AND POWER ELECTRONICS ASSEMBLIES INCORPORATING THE SAME

(71) Applicant: Toyota Motor Engineering & Manufacturing North America, Inc., Plano, TX (US)

(72) Inventors: Shailesh N. Joshi, Ann Arbor, MI (US); Ercan Mehmet Dede, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 231 days.

(21) Appl. No.: 16/170,956

(22) Filed: Oct. 25, 2018

(65) Prior Publication Data
US 2020/0132394 A1    Apr. 30, 2020

(51) Int. Cl.
*F28D 20/02* (2006.01)
*C09K 5/02* (2006.01)
(Continued)

(52) U.S. Cl.
CPC .............. *F28D 20/023* (2013.01); *C09K 5/02* (2013.01); *H01L 23/427* (2013.01); *C09K 5/00* (2013.01); *H01L 23/42* (2013.01); *H01L 23/4275* (2013.01)

(58) Field of Classification Search
CPC ......... F28D 20/02; F28D 20/023; C09K 5/00; C09K 5/02; H01L 23/42; H01L 23/427; H01L 23/4275
(Continued)

(56) References Cited

U.S. PATENT DOCUMENTS 5,202,150 A * 4/1993 Benson .................. G05D 23/01
427/595
5,366,801 A   11/1994 Bryant et al.
(Continued)

FOREIGN PATENT DOCUMENTS

CN     107541171 A    1/2018
FR       2995315 B1   9/2015

OTHER PUBLICATIONS

Goodson, Metal Inverse Opals could Better Cool electronics, Apr. 18, 2016, electronic Cooling, retrieved from web site electronics-cooling.com/2016/04/metal-inverse-opals-could-better-cool-electronics/ (Year: 2016).*
(Continued)

*Primary Examiner* — Joel M Attey
(74) *Attorney, Agent, or Firm* — Dinsmore & Shohl LLP

(57) ABSTRACT

A thermal compensation layer includes a metal inverse opal (MIO) layer that includes a plurality of core-shell phase change (PC) particles encapsulated within a metal of the MIO layer. Each of the core-shell PC particles includes a core that includes a PCM having a PC temperature in a range of from 100° C. to 250° C., and a shell that includes a shell material having a melt temperature greater than the PC temperature of the PCM. A power electronics assembly includes a substrate having a thermal compensation layer formed proximate a surface of the substrate, the thermal compensation layer comprising an MIO layer that includes a plurality of core-shell PC particles encapsulated within a metal of the MIO layer. The power electronics assembly further includes an electronic device bonded to the thermal compensation layer at a first surface of the electronic device.

16 Claims, 15 Drawing Sheets

(51) Int. Cl.
*H01L 23/427* (2006.01)
*C09K 5/00* (2006.01)
*H01L 23/42* (2006.01)

(58) Field of Classification Search
USPC ........................................ 165/80.4
See application file for complete search history.

(56) References Cited

U.S. PATENT DOCUMENTS

| | | | |
|---|---|---|---|
| 5,804,297 | A | 9/1998 | Colvin et al. |
| 8,003,028 | B2 | 8/2011 | Lawton |
| 9,392,730 | B2 | 7/2016 | Hartmann et al. |
| 2004/0159422 | A1* | 8/2004 | Zuo ...................... F28D 15/046 165/104.14 |
| 2009/0294094 | A1 | 12/2009 | Suzuki et al. |
| 2010/0236760 | A1* | 9/2010 | Hsieh .................... F28F 13/187 165/104.26 |
| 2013/0087311 | A1* | 4/2013 | Lee ....................... H01L 23/427 165/67 |
| 2014/0367607 | A1* | 12/2014 | Weng .................. H01L 23/4275 252/77 |
| 2018/0009996 | A1* | 1/2018 | Lentz ..................... A01N 59/26 |
| 2018/0320984 | A1* | 11/2018 | Lewis ................. F28D 15/0283 |
| 2019/0003781 | A1* | 1/2019 | Caniere .................. F25D 3/005 |
| 2019/0077936 | A1* | 3/2019 | Liao .................. B01J 20/28095 |

OTHER PUBLICATIONS

Hong, "Encapsulated Nanostructured Phase Change Materials for Thermal Management", Electronic Theses and Dissertations, 2011.

* cited by examiner

US 11,067,343 B2

THERMAL COMPENSATION LAYERS WITH CORE-SHELL PHASE CHANGE PARTICLES AND POWER ELECTRONICS ASSEMBLIES INCORPORATING THE SAME

TECHNICAL FIELD

The present specification generally relates to power electronics assemblies, and more particularly, to power electronics assemblies incorporating thermal compensation layers with high heat capacity.

BACKGROUND

Power electronics devices are often utilized in high-power electrical applications, such as inverter systems for hybrid electric vehicles and electric vehicles. Such power electronics devices include power semiconductor devices, such as power IGBTs and power transistors thermally bonded to a metal substrate. The metal substrate may then be further thermally bonded to a cooling structure, such as a heat sink.

With advances in battery technology and increases in electronics device packaging density, operating temperatures of power electronics devices have increased and are currently approaching 200° C. The heat generated through operation of the power electronics devices is thermally conducted away from the electronics devices to prevent damage to the power electronics devices. However, at operating temperatures approaching 200° C., the rate at which heat may be thermally conducted away from the power electronics devices may be limited, which can result in even greater temperature increases and potential for thermal damage to electrical components. Thus, there is a continuing need for structures and methods to manage heat removal from electronic devices used in power electronic assemblies.

SUMMARY

In one embodiment, a thermal compensation layer includes a metal inverse opal (MIO) layer that includes a plurality of core-shell phase change (PC) particles encapsulated within a metal of the MIO layer. Each of the core-shell PC particles includes a core that includes a phase change material (PCM) that may have a PC temperature in a range of from 100° C. to 250° C., and a shell that includes a shell material having a melt temperature greater than the PC temperature of the PCM. In some embodiments, the thermal compensation layer may further include a cap layer deposited on the MIO layer.

In another embodiment, a process for forming a thermal compensation layer may include depositing a plurality of core-shell PC particles onto a surface of a substrate or an electronic device. Each of the plurality of core-shell PC particles includes a core including a PCM with a PC temperature in a range of from 100° C. to 250° C., and a shell including a shell material having a melt temperature greater than the PC temperature of the PCM. The process may further include depositing a metal over the plurality of core-shell PC particles to form an MIO layer and depositing/overgrowing a cap layer on the MIO layer.

In yet another embodiment, a power electronics assembly may include a substrate having a thermal compensation layer formed proximate a surface of the substrate. The thermal compensation layer includes a metal inverse opal (MIO) layer and a cap layer on the MIO layer, the MIO layer including a plurality of core-shell PC particles encapsulated within a metal of the MIO layer. The power electronics assembly may further include an electronic device bonded to the thermal compensation layer at a first surface of the electronic device. The core-shell PC particles include a core that includes a PCM that may have a PC temperature in a range of from 100° C. to 250° C., and a shell that includes a shell material having a melt temperature greater than the PC temperature of the PCM.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
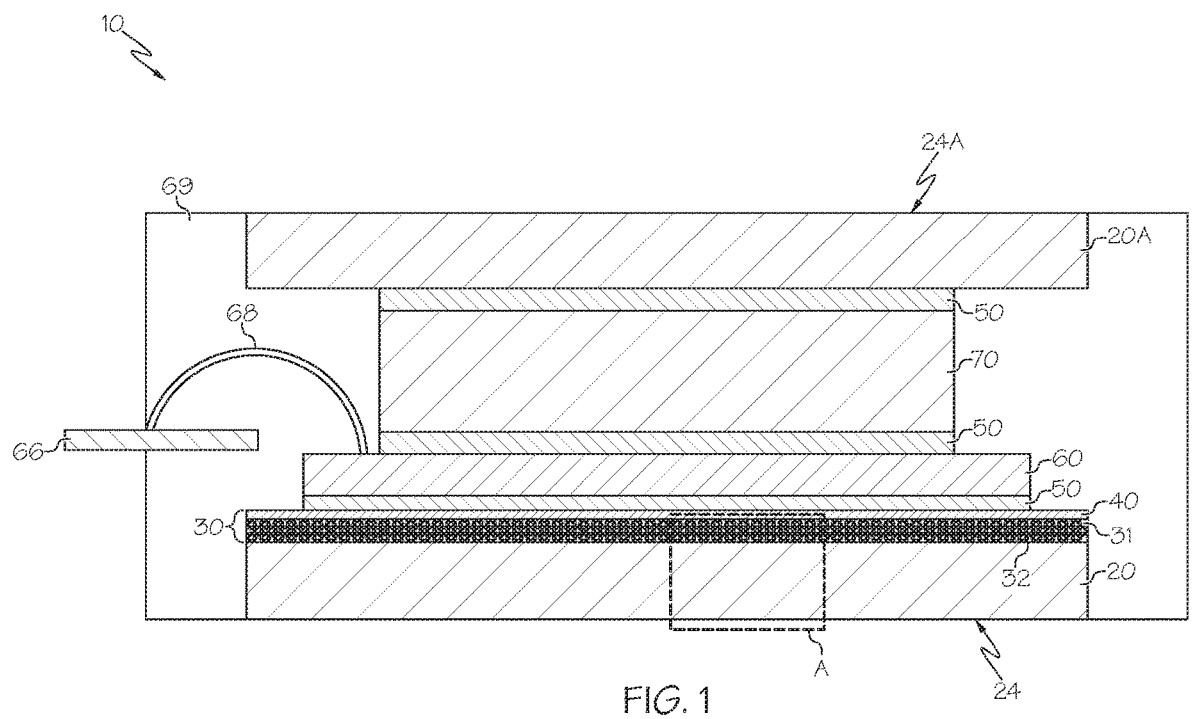
FIG. 1 schematically depicts a side cross-sectional view of a power electronics assembly, according to one or more embodiments shown and described herein.

The present disclosure is directed to power electronic assemblies and thermal compensation layers operable to increase the heat capacity of substrates of the power electronics assembly to better remove heat from the power electronic assemblies. Referring to FIG. 1, an embodiment of a power electronics assembly 10 having a thermal compensation layer 30 according to the present disclosure is schematically depicted. The power electronics assembly 10 may include a substrate 20 having the thermal compensation layer 30 formed on a surface of the substrate 20. The thermal compensation layer 30 includes a metal inverse opal (MIO) layer 31 having a plurality of core-shell PC particles 32 encapsulated within a metal 33 of the MIO layer 31. The thermal compensation layer 32 may also include a cap layer 40 that includes metal overgrown on top of the MIO layer 31. The power electronics assembly 10 may further include an electronic device 60 that may be bonded to the thermal compensation layer 30 at a first surface of the electronic device 60. The core-shell PC particles 32 each have a core that includes a phase change material (PCM) that changes phase at a temperature within an operating temperature range of the electronic device 60 and a shell encapsulating the PCM. The power electronics assembly 10 may further include a bonding layer 50 disposed between the thermal compensation layer 30 and the electronic device 60. The core-shell PC particles 32 encapsulated within the MIO layer 31 of the thermal compensation layer 30 may increase the heat capacity of the substrate 20, thereby enabling the thermal compensation layer 30 to remove more heat from the electronic device 60 compared to a solid substrate or an MIO layer without the core-shell PC particles 32. Various embodiments of the thermal compensation layer and power electronics assemblies using the thermal compensation layers will be described in more detail herein.

During bonding of the electronic device 60 to the substrate 20 and during operation of the electronic device 60, the power electronic assembly 10, in particular the electronic device 60, may be subjected to temperature cycling up to temperatures of 200° C. Temperatures of up to 200° C. and temperature cycling of the power electronics assembly 10 can cause thermal-related damage to the electronic devices 60 of the power electronics assembly 10. Heat may be removed from the electronics devices 60 during operation of the power electronics assembly 10 to reduce the temperature and mitigate thermal damage to the electronic devices 60. However, the rate of heat removal may be limited by the rate of heat conduction through the substrate 20 or other components of the power electronics assembly 10.

In particular, some power electronics assemblies may include a hollow sphere MIO layer disposed between the bonding layer 50 and the substrate 20 or as part of the substrate 20 to relieve thermal stress at the bond between the substrate and the electronics device. The hollow sphere MIO layer may include a skeletal network of metal with a periodic arrangement of interconnected hollow spheres. The hollow spheres refer to spherical voids within the MIO layer that do not have a solid, such as a core-shell PC particle or other solid particle, disposed therein. The hollow sphere MIO layer may exhibit a reduced Young's modulus (e.g., reduced stiffness), which may allow some flexibility in the MIO layer to compensate for the thermal stresses during temperature cycling. However, in the hollow sphere MIO, the presence of the hollow spheres reduces the amount of metal in the MIO layer, which reduces the cross-sectional area for conductive heat transfer away from the electronic device 60. Therefore, hollow sphere MIO layers having a network of hollow spheres reduces the heat transfer rate through the substrate 20, which makes the substrate 20 less effective for removing heat from the electronic device 60.

Referring to FIG. 1, as previously discussed, the power electronics assemblies 10 of the present disclosure include a thermal compensation layer 30 that includes an MIO layer 31 with a plurality of core-shell PC particles 32 embedded in the metal of the MIO layer 31. For example, in some embodiments, power electronic assemblies 10 of the present disclosure may include the substrate 20 having the thermal compensation layer 30 formed on a surface of the substrate 20. The core of each of the core-shell PC particles 32 includes a PCM that changes phase at a phase change temperature (PC temperature) within the operating temperature range of the electronic device 60. The change in phase of the PCM may absorb additional heat generated by the electronic device 60 at constant temperature, thereby increasing the heat capacity of the thermal compensation layer 30 and enabling the thermal compensation layer 30 of the present disclosure to remove a greater amount of heat from the electronic device 60 compared to a solid substrate or a substrate having a hollow sphere MIO layer. Thus, the thermal compensation layer 30 of the present disclosure provides improved heat capacity to remove a greater amount of heat from the electronic devices 60 of the power electronics assembly 10 during operating periods of high heat output, thereby maintaining the electronic devices 60 at a lower temperature.

Referring again to FIG. 1, a power electronics assembly 10 having double-sided cooling of the electronics device 60 is depicted. In some embodiments, the power electronics assembly 10 may include at least one electronics device 60 positioned within a stack of thermally coupled components. The electronic devices 60 may form one or more layers positioned between one or more additional layers that include substrates, bond layers, spacer layers, and/or the like. For example, in FIG. 1, the electronic device 60 may be bonded to the substrate 20 by a bonding layer 50 at one surface of the electronic device 60. The substrate 20 may have the thermal compensation layer 30 that includes the MIO layer 31 and the cap layer 40 deposited on the MIO layer 31. The other side of the electronic device 60 may be bonded to a spacer layer 70 by another bonding layer 50. The spacer layer 70 may include a spacer material that is capable of electric and thermal conduction, such as but not limited to copper, aluminum, nickel, gallium, or any other metal, alloy, or compound that is capable of electrical and/or thermal conduction. The spacer layer 70 may be further bonded to a supplemental substrate 20A by still another bonding layer 50.

The substrate 20 and the supplemental substrate 20A may be a thermally conductive metal, a semiconductor material, an electrode, or the like. In some embodiments, the substrate 20 may be a collector terminal of the power electronics assembly 10 and the supplemental substrate 20A may be an emitter terminal of the power electronics assembly 10. The power electronics assembly 10 may also include a gate electrode 66 electrically coupled to the electronic device 60 the gate electrode 66 may be directly electrically coupled to the electronic device 60 or electrically coupled to the electronic device 60 via a wire 68. In some embodiments, a signal such as a gate voltage may be applied to the gate electrode 66 to cause the electronic device 60 to conduct such that the substrate 20 and the supplemental substrate 20A may be electrically coupled. The power electronics assembly 10 may include a resin 69 configured to provide a supporting structure or package to the components of the power electronics assembly 10. Additionally, the power electronics assembly 10 may be coupled to one or more coolers (not shown) on the outer surfaces of the power electronics assembly 10, such as cooling surface 24 of the substrate 20 or the cooling surface 24A of the supplemental substrate 20A. The cooler, while not depicted, may include a heat sink; a liquid phase cooling apparatus, either active (e.g., utilizing jet channels and pumps), passive (e.g., utilizing thermal convection, conduction, radiation, including processes such as nucleation or the like), or a combination of both; or any other cooler device capable of removing heat from the power electronics assembly 10. The coolers may be coupled to the surfaces of the power electronics assembly 10 using thermal grease or other thermally conductive bonding material. FIG. 1 depicts only one possible embodiment of a power electronics assembly 10 and should not be limited to such components, arrangement, and configuration. For example, in some embodiments, the power electronics assembly 10 may include single-sided cooling only.

Figure 2:
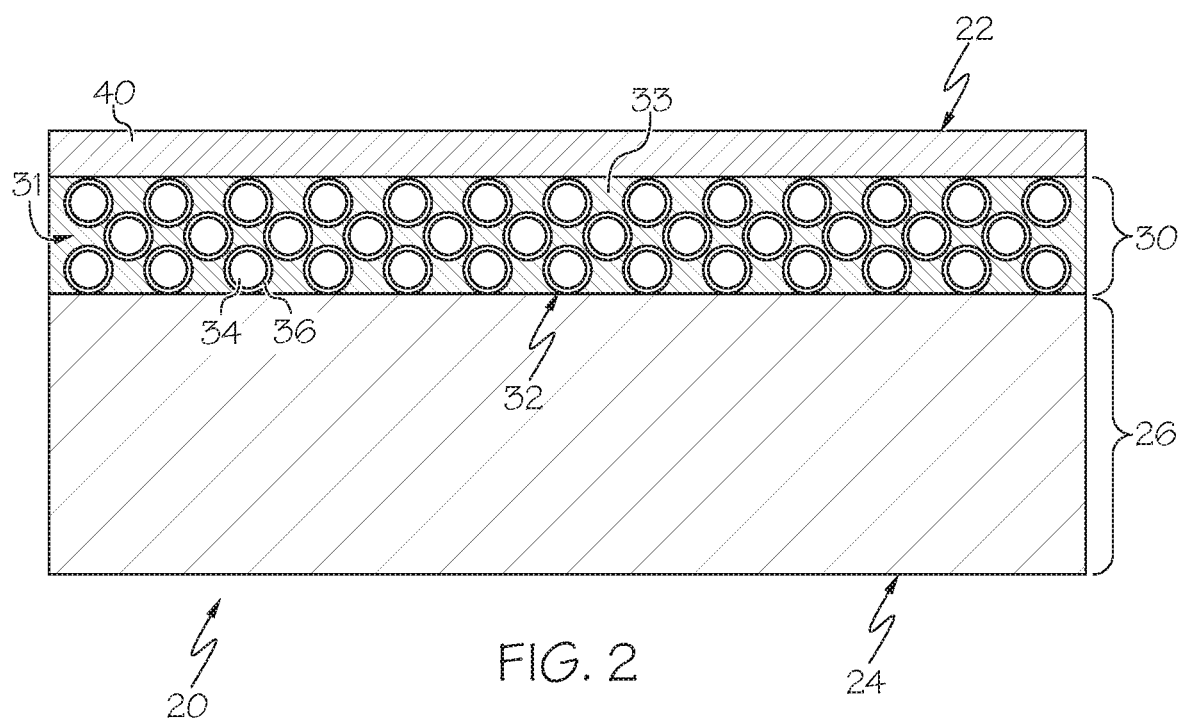
FIG. 2 schematically depicts a portion of the substrate of the power electronics assembly of FIG. 1 identified by window A of FIG. 1, the substrate having a thermal compensation layer, according to one or more embodiments shown and described herein.

Referring to FIG. 2, the substrate 20 may include a substrate body 26 and the thermal compensation layer 30. The substrate body 26 may include a thermally conductive material, such as a thermally conductive metal for example, which is capable of conducting heat away from the electronic device 60 of the power electronics assembly 10. In some embodiments, the substrate body 26 may include a thermally conductive metal, such as but not limited to copper (Cu), oxygen free copper, copper alloys, aluminum (Al), aluminum alloys, other thermally conductive metals, or combinations of these. The substrate 20 may include a bonding surface 22 facing the electronic device 60 and bonded thereto. The substrate 20 may also include a cooling surface 24, which may be a surface opposite the bonding surface 22 or on one or more of the perpendicular sides of the substrate 20. The substrate 20 may have a thickness of from 0.1 millimeters (mm) to 2 mm, such as from 0.5 mm to 2 mm, or from 1 mm to 2 mm. In some embodiments, the cooling surface 24 of the substrate 20 may be coupled to a cooling structure 70, such as a heat sink, heat exchanger, or other cooling structure.

Referring to FIG. 2, in some embodiments, the thermal compensation layer 30 of the substrate 20 may be formed proximate the bonding surface 22 of the substrate 20. The proportions and dimensions in FIG. 2, as well as in the other drawings, are exaggerated for purposes of illustrating the subject matter and are not intended to be limiting in any way. As previously discussed, the thermal compensation layer 30 includes the MIO layer 31 that includes the plurality of core-shell PC particles 32 at least partially encapsulated within the metal 33 of the MIO layer 31. The core-shell PC particles 32 may be partially or fully embedded or encapsulated within the metal 33 of the MIO layer 31. In some embodiments, the thermal compensation layer 30 may be formed directly on a surface of the substrate body 26 to produce the substrate 20. "Formed directly" refers to the thermal compensation layer 30 being in direct contact with the surface of the substrate body 26 with no intervening bonding layer. Alternatively, in other embodiments, the thermal compensation layer 30 may be formed independent from the substrate body 26 and then bonded to a surface of the substrate body 26 to form the substrate 20.

Figure 3:
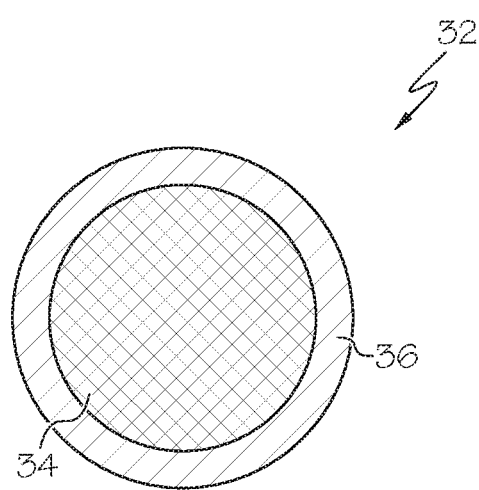
FIG. 3 schematically depicts a cross-sectional view of a core-shell PC particle of the thermal compensation layer depicted in FIG. 2, according to one or more embodiments shown and described herein.

Referring now to FIG. 3, as previously discussed, the core-shell PC particles 32 include a core 34 encapsulated within a shell 36. In some embodiments, the core 34 may be fully encapsulated within the shell 36. The core 34 includes a phase change material (PCM) that changes phase at a phase change temperature that is within an operating temperature range of the power electronics assembly 10 or electronic device 60 of the power electronics assembly 10. The phase change of the PCM may be a change in phase between liquid and solid phases or a change in phase between two solids phases, such as between an amorphous solid phase and a crystalline or partially crystalline solid phase. In some embodiments, the core 34 may include a PCM having a PC temperature that is within an operating temperature range of the electronic device 60. In some embodiments, the core 34 may include a PCM having a PC temperature of from 50° C. to 250° C., such as from 100° C. to 250° C., or even 150° C. to 250° C.

The PCM may be water insoluble. The PCM may include a paraffin or a metal. Paraffin PCMs may include paraffin waxes comprising one or a plurality of saturated hydrocarbons having at least 20 carbon atoms, such as from 20 to 40 carbon atoms and a melt temperature in a range of 50° C. to 250° C. Metal PCMs may include but are not limited to tin (Sn), indium (In), other metals having melt temperatures of from 50° C. to 250° C., tin alloys, indium alloys, or combinations of these. In some embodiments, the PCM of the core 34 may include tin.

Figure 4:
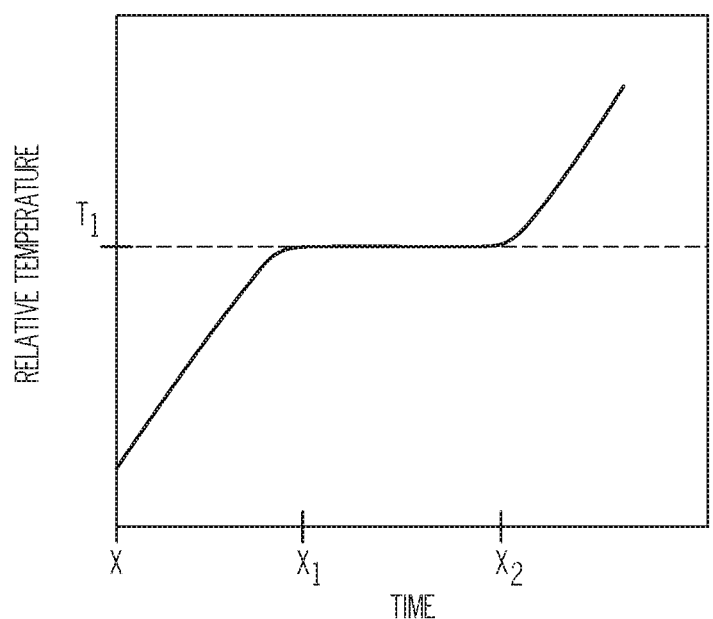
FIG. 4 graphically depicts the temperature of a PCM of the core-shell PC particles of FIG. 3 (y-axis) as a function of time (x-axis) under constant applied heat flux; according to one or more embodiments shown and described herein.

Referring to FIG. 4, the temperature of a PCM in response to constant heat input as a function of time is depicted. In FIG. 4, X is time zero at which the PCM is at a temperature less than the PC temperature at $T_1$. As constant heat is applied between time X and $X_1$, the temperature of the PCM increases. When the PCM reaches the PC temperature $T_1$ at time $X_1$, additional heat input causes the PCM to change phase, such as transitioning from a solid to a liquid or between a crystalline solid and amorphous solid. Between times $X_1$ and $X_2$, the heat input energy is absorbed by the PCM as it changes phase and the temperature of the PCM remains constant. Thus, during the phase change, the PCM absorbs additional heat without a corresponding increase in the temperature. Once all of the PCM has changed phase at time $X_2$, continued heat input may cause the temperature of the PCM to increase again.

The temperature response of the PCM to constant heat removal from the PCM as a function of time may be the reverse of the heat input response in FIG. 4. With the PCM maintained at a temperature greater than the PC temperature $T_1$, constant heat removal may cause the temperature of the PCM to decrease. When the temperature of the PCM reaches the PC temperature $T_1$, continued heat removal causes the PCM to change phase, such as transitioning from a liquid back into a solid. Continued heat removal facilitates the change of phase of the PCM, and the temperature of the PCM remains constant and equal to $T_1$. When all of the PCM has changed phase, further heat removal causes the temperature of the PCM to continue to decrease. Thus, heat may be removed to "reset" the PCM of the core-shell PC particles 32 during periods of low or no heat generation by the electronics device 60.

The shell 36 of the core-shell PC particles 32 comprises a shell material. The shell material may be an electrically insulating material. The shell material may also be a material capable of being electroplated or electroless plated with the metal 33 of the MIO layer 31. The shell material may have a melt temperature greater than the PC temperature of the PCM in the core 34. In some embodiments, the shell material may have a melt temperature greater than a transient liquid phase (TLP) sintering temperature of a bonding layer 50 in contact with the thermal compensation layer 30. TLP sintering is one possible method that may be used to bond the substrate 20 to the electronic device 60 during manufacturing of the power electronics assembly 10. In some embodiments, the shell material may have a thermal conductivity of greater than or equal to 50 watts per meter per degree Kelvin (W/(m*K)), such as from 50 W/(m*K) to 100 W/(m*K). In some embodiments, the shell material may have a melt temperature greater than 250° C., such as greater than 300° C., greater than 350° C., greater than 400° C., or even greater than 500° C.

In some embodiments, the shell material may include a metal oxide or an electrically insulating polymer capable of surviving temperatures greater than the PC temperature of the PCM of the core 34 or greater than the operating temperature range of the power electronics assembly 10 (e.g., greater than about 250° C.). Metal oxides for the shell material may include, but are not limited to silica, alumina, titania, magnesium oxide, zirconia, other metal oxides, or combinations of these. Electrically insulating polymers for the shell material may include, but are not limited to, polyamides, polyimides, polyesters, aromatic polyethers, benzimidazoles, other electrically insulating polymers, or combinations of these. In some embodiments, the shell material may include silica.

In some embodiments, the core-shell PC particles 32 may be spherical core-shell PC particles. Alternatively, in other embodiments, the core-shell PC particles 32 may be non-spherical core-shell PC particles, such as core-shell PC particles having an ovoid, cubic, cylindrical, flat, rod-like shape, irregular shape, or other shape. In some embodiments, the shape of the core-shell PC particles 32 may be modified to tune the properties of the MIO layer 31. In some embodiments, the size of the core-shell PC particles 32 may be modified to tune the Young's modulus of the MIO layer 31. For example, reducing the average particle size of the core-shell PC particles 32 may increase the Young's modulus of the MIO layer 31 resulting in the MIO layer 31 being stiffer. Conversely, increasing the average particle size of the core-shell PC particles 32 may decrease the Young's modulus of the MIO layer 31 resulting in the MIO layer 31 having greater elasticity.

The core-shell PC particles 32 may have an average particle size of from 2 micrometers (microns µm) to 1,000 µm. The average particles size may be an average diameter of a spherical particle or an average of the largest dimension of non-spherical particles. In some embodiments, the core-shell PC particles may have an average particle size of from 2 µm to 750 µm, from 50 µm to 1,000 µm, from 50 µm to 750 µm, from 100 µm to 1,000 µm, from 100 µm to 750 µm, or from 200 µm to 650 µm. The core-shell PC particles 32 may be made by known processes, such as but not limited to an air suspension coating process, spray drying process, a solution condensation process, other wet-chemical processes or combinations of these.

Figure 5A:
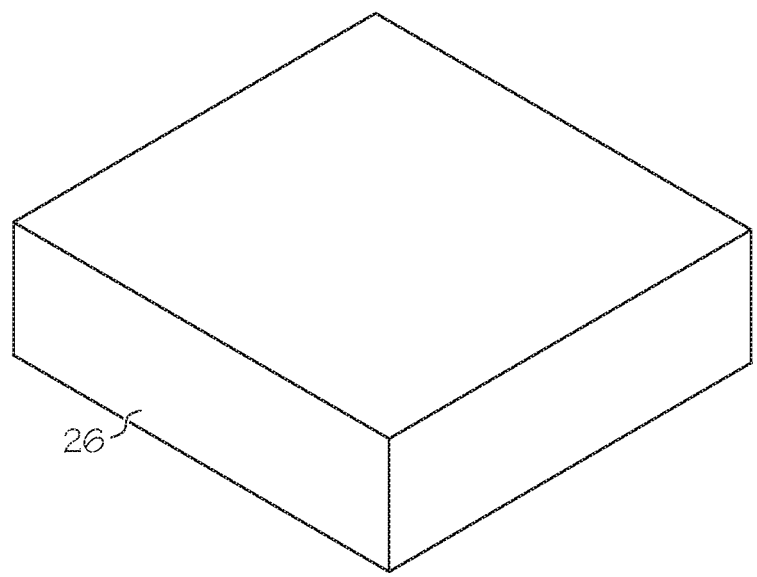
FIG. 5A schematically depicts a perspective view of the substrate of FIG. 2 prior to formation of a thermal compensation layer thereon, according to one or more embodiments shown and described herein.
Figure 5B:
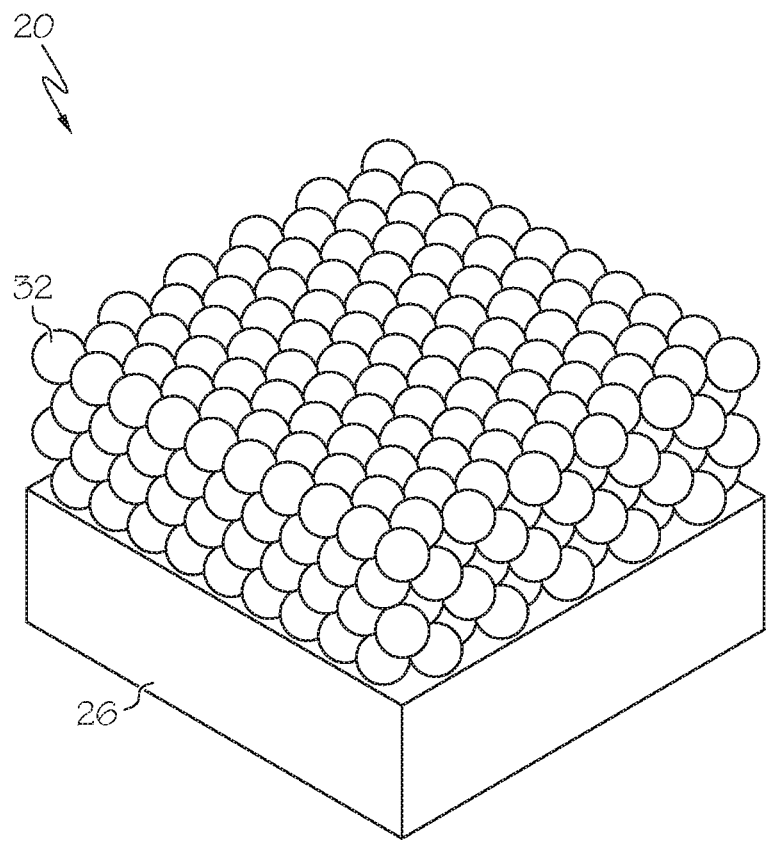
FIG. 5B schematically depicts a perspective view of the substrate of FIG. 5A having a plurality of core-shell PC particles deposited on a surface of the substrate, according to one or more embodiments shown and described herein.

Referring now to FIGS. 5A-5D, a process for forming the thermal compensation layer 30 will be described in further detail. FIG. 5A shows the substrate body 26 prior to formation of the thermal compensation layer 30. Referring to FIG. 5B, the process for forming the thermal compensation layer 30 may include depositing the plurality of core-shell PC particles 32 onto a surface of the substrate body 26 or a surface of the electronic device 60 (FIG. 1). Although the thermal compensation layer 30 is depicted in FIG. 5B as being formed on a surface of the substrate body 26, the thermal compensation layer 30 may also be formed on other surfaces of the power electronics assembly 10, as described subsequently in this disclosure. In some embodiments, the plurality of core-shell PC particles 32 may be deposited by a drop casting process or other particle deposition process. For example, in some embodiments, the core-shell PC particles 32 may be deposited by a controlled withdrawal process in which a colloidal suspension of the core-shell PC particles 32 in a diluent is applied to the surface to which the thermal compensation layer 30 is to be applied. The diluent (e.g., water) may then be slowly evaporated. Evaporation of the diluent may cause the core-shell PC particles 32 to align in a closely packed array that is a few layers thick. The core-shell PC particles 32 may be deposited in a non-random array or may be randomly deposited on the surface. In some embodiments, the plurality of core-shell PC particles 32 may be further coupled to one another, such as through sintering or other coupling process. After removal of the diluent, the core-shell PC particles 32 may be arranged such that a plurality of void spaces are present around each of the core-shell PC particles 32. The core-shell PC particles 32 may have any of the characteristics or properties described herein.

Figure 5C:
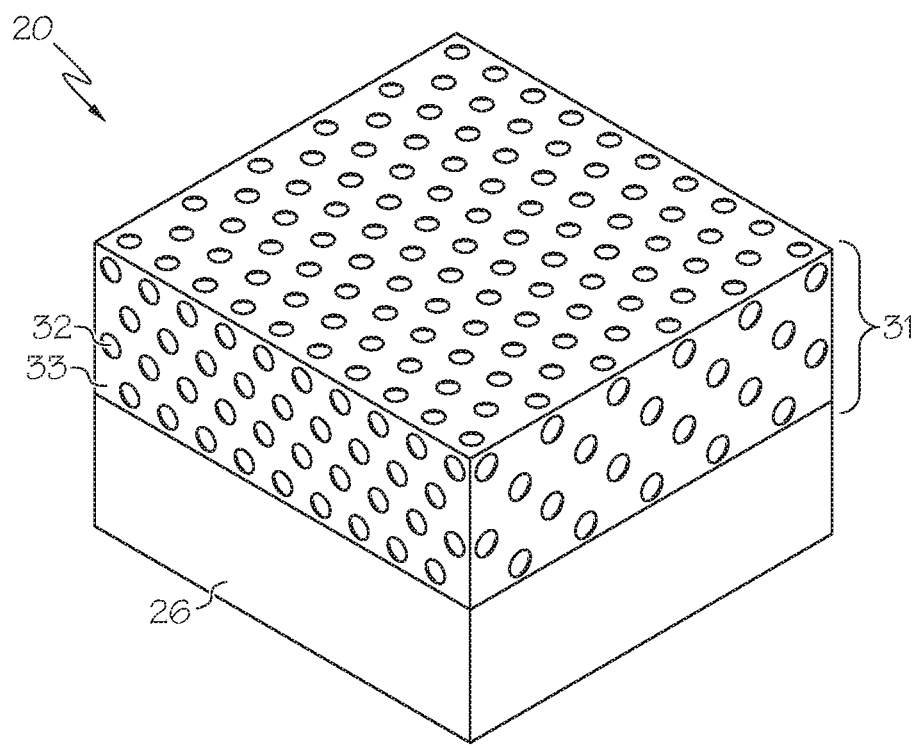
FIG. 5C schematically depicts a perspective view of the substrate of FIG. 5B in which a metal has been electroplated over the plurality of core-shell PC particles to form a metal inverse opal (MIO) layer, according to one or more embodiments shown and described herein.

Referring to FIG. 5C, the process for forming the thermal compensation layer 30 may further include depositing the metal 33 over the plurality of core-shell PC particles 32 to form the MIO layer 31. The metal 33 may be deposited on the surface to which the thermal compensation layer 30 is being applied (e.g., a surface of substrate 20 or electronic device 60) and in the void spaces between the plurality of core-shell PC particles 32. The metal 33 may be deposited such that the metal 30 fills the void spaces between the core-shell PC particles 32. Depositing the metal 33 may include electroplating or electroless plating the metal 33 over the plurality of core-shell PC particles 32. In some embodiments, the plurality of core-shell PC particles 32 may be treated with a seeding composition, such as copper sulfate or other metal compound, prior to electroplating to facilitate electroplating or electroless plating of the metal 33.

The metal 33 may include any metal that can be electroplated or electroless plated. The metal 33 for the MIO layer 31, may have a thermal conductivity greater than 50 W/(m*K), such as greater than 100 W/(m*K), or even greater than 150 W/(m*K). In some embodiments, the metal 33 of the MIO layer 31 may be a metal having a melt temperature greater than the TLP sintering temperature of the bonding layer 50. The metal 33 of the MIO layer 31 may include, but is not limited to, copper (Cu), nickel (Ni), aluminum (Al), silver (Ag), zinc (Zn), magnesium (Mg), gold (Au) other thermally conductive metals, alloys of these metals, or combinations thereof. In some embodiments, the metal 33 may be copper or a copper alloy such that the MIO layer 31 is a copper inverse opal (CIO) layer, in which the core-shell PC particles 32 are encapsulated in the copper or copper alloy. The MIO layer 31 may have a thickness of from 50 μm to 1,500 μm, such as from 50 μm to 1,000 μm, from 50 μm to 750 μm, from 100 μm to 1,500 μm, from 100 μm to 1,000 μm, from 100 μm to 750 μm, or from 200 μm to 650 μm.

In typical MIO processes, sacrificial opals may be used in place of the core-shell PC particles, and an additional removal step may be conducted after depositing the metal 33 over the sacrificial opals to remove the sacrificial opals and form an interconnected porous network of hollow spheres. However, the process for producing the thermal compensation layer 30 disclosed herein may not require the removal step, since the MIO layer 31 of the thermal compensation layer 30 disclosed herein is intended to include and retain the plurality of core-shell PC particles 32 embedded therein. As shown in FIG. 5C, in some embodiments, depositing the metal 33 may produce an MIO layer 31 in which at least a portion of the core-shell PC particles 32 may be exposed at the surface of the MIO layer 31.

Figure 5D:
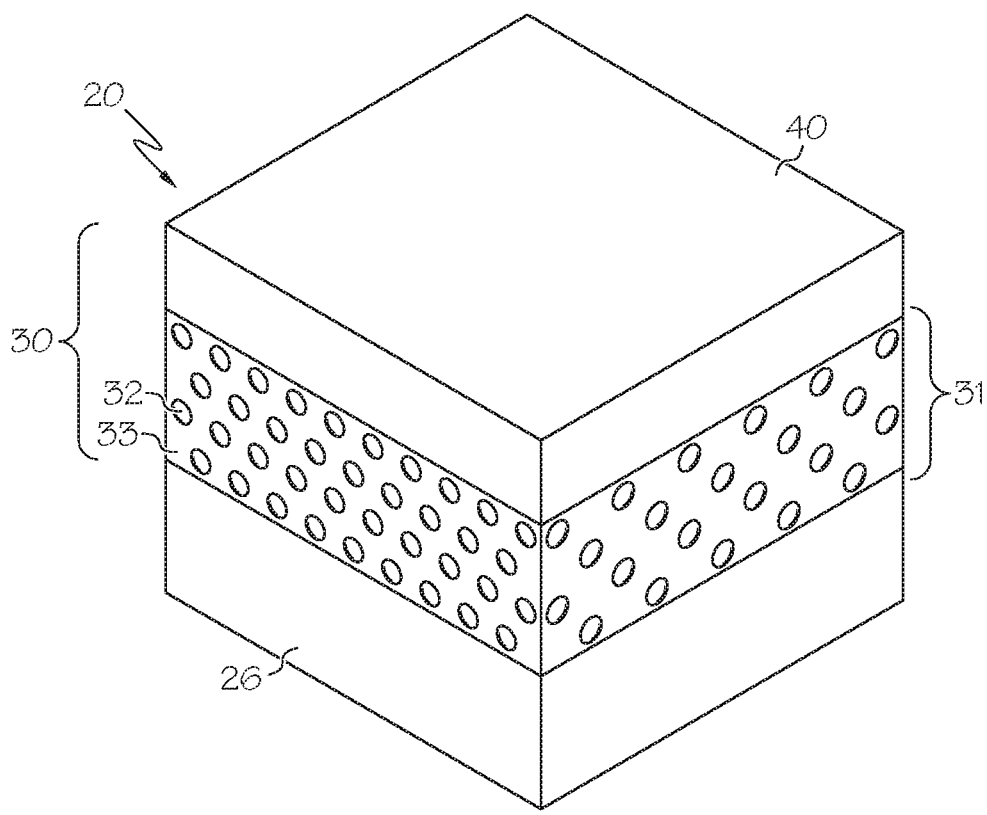
FIG. 5D schematically depicts a perspective view of the substrate of FIG. 5C in which additional metal has been overgrown on top of the MIO layer to form a cap layer, according to one or more embodiments shown and described herein.

Referring now to FIG. 5D, in some embodiments, the metal 33 may continue to be deposited onto the MIO layer 31 to form the cap layer 40 on top of the MIO layer 31. The metal of the cap layer 40 may be deposited on the MIO layer 31 according to any of the previously described methods and techniques for depositing a metal. Although shown in FIGS. 5A-5D as a process of forming the thermal compensation layer 30 on the substrate 20, in some embodiments, the thermal compensation layer 30 may be formed on one or more surfaces of the electronic device 10 or any other component of the power electronics assembly 10. The thermal compensation layer 30 may be formed on a surface of the electronic device 60 or other component according to the method previously described in relation to FIGS. 5A-5D.

Figure 5E:
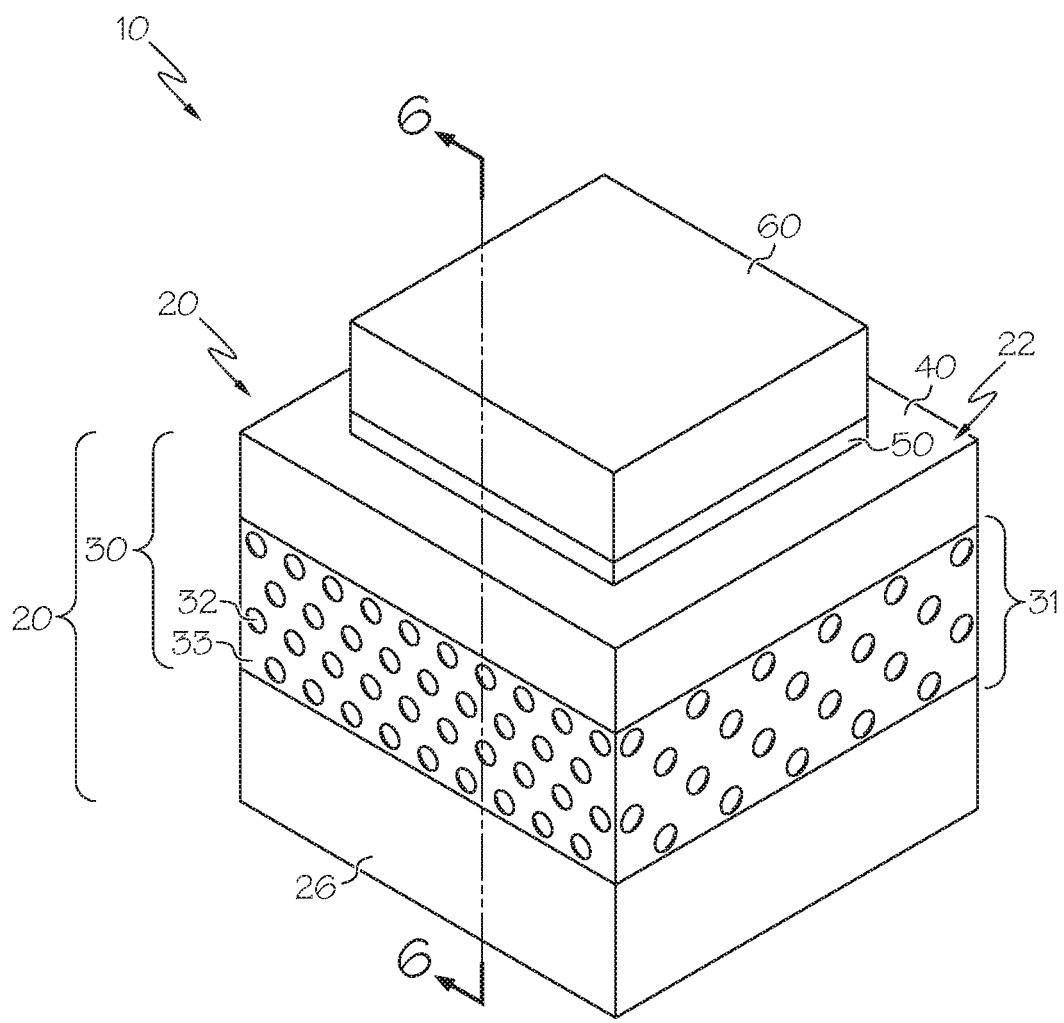
FIG. 5E schematically depicts a perspective view of the substrate of FIG. 5C in which an electronics device is coupled to the cap layer by a bonding layer to form a power electronics assembly.
Figure 6:
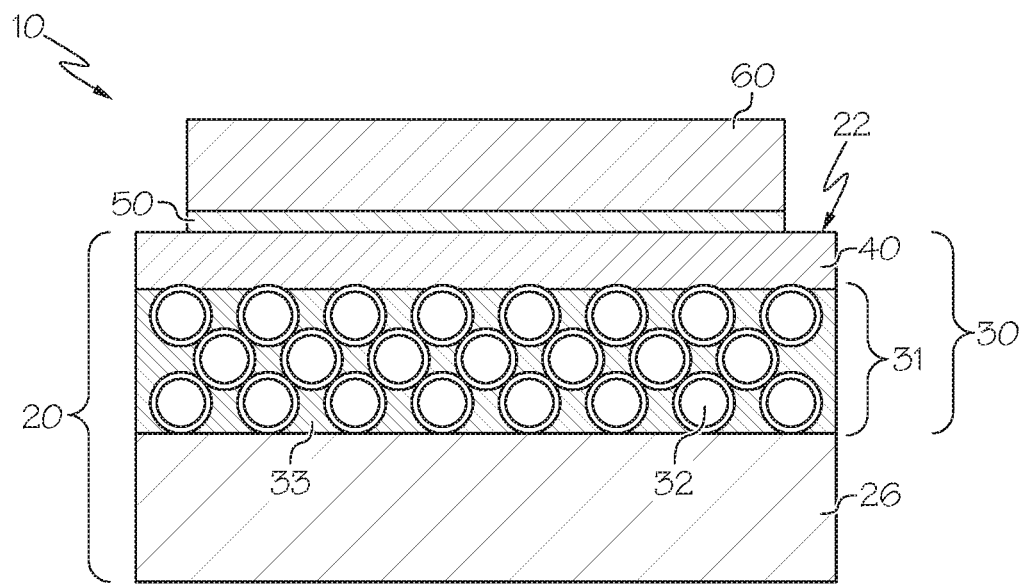
FIG. 6 schematically depicts another embodiment of a power electronics assembly, according to one or more embodiments shown and described herein.

Referring now to FIGS. 5E and 6, one or more of the electronics devices 60 may be bonded to the cap layer 40 of the thermal compensation layer 30 to form at least a portion of the power electronics assembly 10. FIG. 6 depicts a cross-sectional view of the power electronics assembly 10 of FIG. 5E taken along reference line 6-6. In some embodiments, the electronic device 60 may be coupled to the cap layer 40 by a bonding layer 50 disposed between the cap layer 40 and the electronics device 60. The bonding layer 50 may be a TLP layer, solder layer, sintered layer, or other bonding layer capable of bonding the cap layer 40 to the electronics device 60. In some embodiments, the thermal compensation layer 30 may be formed on a surface of the electronics device 60 and formation of the power electronics assembly 10 may include bonding the substrate 20 to the cap layer 40 of the thermal compensation layer 30 formed on the electronics device 60.

Figure 7:
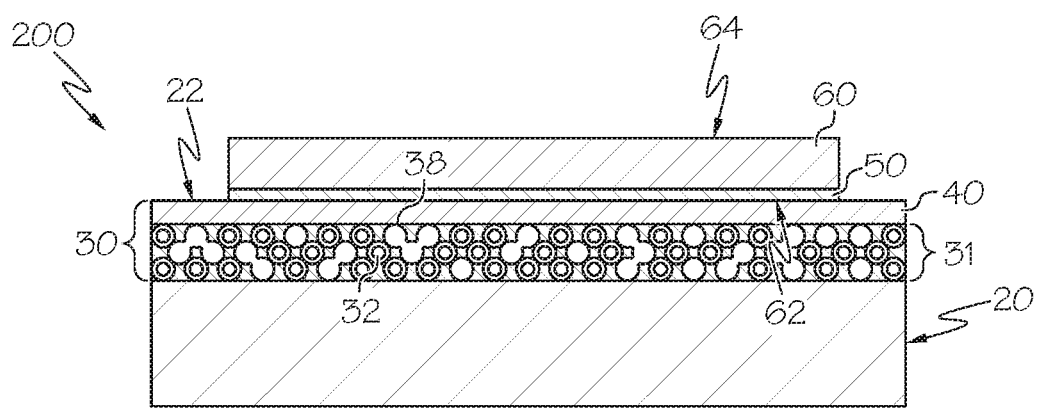
FIG. 7 schematically depicts a cross-sectional view of another embodiment of a power electronics assembly in which an MIO layer of the substrate includes a plurality of core-shell PC particles as well as a plurality of voids, according to one or more embodiments shown and described herein.

Referring to FIG. 7, in some embodiments, the MIO layer 31 may further include a plurality of interconnected hollow spheres 38 in addition to the plurality of core-shell PC particles 32. In these embodiments, the process for forming the thermal compensation layer 30 may include depositing core-shell PC particles 32 and sacrificial opals (not shown) onto the surface of the substrate body 26. Sacrificial opals may include polystyrene spheres or other sacrificial opals that may be dissolved in an organic solvent or etching solution to produce a plurality of hollow spheres. The sacrificial opals and core-shell PC particles may be deposited separately or may be admixed prior to deposition. In some embodiments, the process may further include electroplating the metal 33 over the core-shell PC particles 32 and sacrificial opals, and after electroplating, dissolving the plurality of sacrificial opals to form the MIO layer 31 having a plurality of core-shell PC particles 32 and a plurality of interconnected hollow spheres 38 inter-dispersed with the plurality of core-shell PC particles 32. Once the MIO layer 31 is formed, the cap layer 40 may be overgrown or deposited onto the MIO layer 31.

Including the plurality of interconnected hollow spheres 38 may enable the thermal compensation layer 30 described herein to compensate for thermally-induced stresses, e.g., thermal stresses, resulting from fabrication (e.g., transient liquid phase (TLP) sintering) and operational conditions (e.g., transient electric loads causing high changes in temperature). Because the substrate 20 and electronic device 60 of the power electronics assembly 10 are made of different materials, the differences in the coefficient of thermal expansion (CTE) for each material may cause large thermally-induced stresses within the substrate 20, electronic device 60, and thermal compensation layer 30. Including the interconnected hollow spheres 38 in the thermal compensation layer 30 may change the Young's modulus of the thermal compensation layer 30 to enable the thermal compensation layer 30 to compensate for thermal stresses caused by differences in CTE of the various layers. Increasing or decreasing the size and/or number of interconnected hollow spheres 38 in the thermal compensation layer 30 may enable the Young's modulus of the thermal compensation layer to be further tuned. The presence of the interconnected hollow spheres 38 in the thermal compensation layer 30 may further enable a cooling fluid to be circulated through the interconnected hollow spheres 38 to provide additional heat transfer within the thermal compensation layer 30.

The MIO layer forming process previously described may be repeated one or more times to produce a thermal compensation layer 30 having a plurality of MIO layers 31, such as 2, 3, 4, 5, 6, or more than 6 MIO layers 31. For example, in some embodiments, the MIO layer 31 may be a first MIO layer having first core-shell PC particles with a first PCM, and the MIO process may further include depositing a plurality of second core-shell PC particles onto a surface of the first MIO layer. In some embodiments, the second core-shell PC particles may have a second PCM with a PC temperature different than the PC temperature of the first PCM of the first core-shell PC particles. In these, embodiments, the difference in PC temperature between the first core-shell PC particles and the second core-shell PC particles may provide a graduated heat capacity in the thermal compensation layer 30. In other embodiments, the second core-shell PC particles may have a different size than the first core-shell PC particles so that the second MIO layer has a different porosity and a different elastic modulus than the first MIO layer. The MIO process may further include depositing (e.g., electroplating or electroless plating) the metal 33 over the plurality of second core-shell PC particles to form a second MIO layer.

Figure 8:
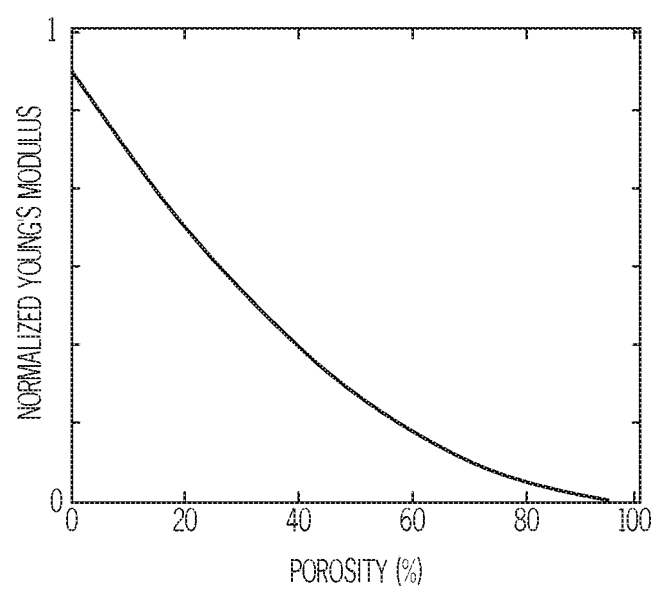
FIG. 8 graphically depicts normalized Young's modulus (y-axis) as a function of porosity (x-axis) in a metal inverse opal layer.

Referring again to FIG. 6, the MIO layer 31 may have a stiffness that is a function of the porosity of the MIO layer 31. In the present disclosure, the porosity of the MIO layer 31 may be related to the proportion of the MIO layer 31 that is not the metal 33 (e.g., the volume taken up by the core-shell PC particles 32). The defined porosity of the MIO layer 31 refers to the porosity as defined by the average particle size and number (i.e., density) of core-shell PC particles 32 in the MIO layer. As used herein, the term "stiffness" refers to the elastic modulus (also known as Young's modulus) of a material, i.e., a measure of a material's resistance to being deformed elastically when a force is applied to the material and may be a function of the porosity of the MIO layer 31. The porosity of the MIO layer 31 can be varied by changing the size (i.e., average particle size) of the core-shell PC particles 32 (and optionally the size of the sacrificial opals). For example, FIG. 8 graphically depicts the Young's modulus of a MIO layer as a function of the porosity. The MIO layer 31, with a constant stiffness or a graded porosity across its thickness, may enable the thermal compensation layer 130 to plastically deform in response to the CTE mismatch between the substrate 20 and electronic device 60 during temperature cycling. Also, the MIO layer 31 may provide sufficient stiffness such that the electronic devices 60 are adequately secured to the substrate 20 for subsequent manufacturing steps performed on the power electronics assembly 10 and/or electronics device 60.

As previously described, the presence of the core-shell PC particles 32 in the MIO layer 31 may increase the heat capacity of the thermal compensation layer 30 compared to hollow sphere MIO layers. The increased heat capacity of the thermal compensation layer 30 may enable the thermal compensation layer 30 to remove more heat from the electronic device 60 of the power electronics assembly compared to hollow sphere MIO layers that do not have the core-shell PC particles 32.

Referring still to FIG. 6, in some embodiments, the electronic device 60 may be a semiconductor device formed from a wide band gap semiconductor material suitable for the manufacture or production of power semiconductor devices such as power IGBTs and power transistors. Semiconductor devices may be formed from wide band gap semiconductor materials including without limitation silicon carbide (SiC), silicon dioxide ($SiO_2$), aluminum nitride (AlN), gallium nitride (GaN), boron nitride (BN), diamond, and the like. In some embodiments, substrate 20 and the electronic device 60 may include a coating, such as nickel (Ni) plating for example, to enable TLP sintering of the electronic device 60 to the substrate 20.

As depicted in FIGS. 1 and 6, the substrate 20 may be bonded to a single electronic device 60. In some embodiments, a plurality of electronic devices 60 may be bonded to the substrate 20. In some embodiments, heat generating devices other than electronic devices 60 or semiconductor devices may be attached to the substrate 20. The electronic devices 60 may be power semiconductor devices such as insulated-gate bipolar transistors (IGBTs), power diodes, power metal-oxide-semiconductor field-effect transistors (MOSFETs), power transistors, and the like. In some embodiment, the semiconductor devices of one or more power electronics assemblies 10 may be electrically coupled to form an inverter circuit or system for vehicular applications, such as for hybrid vehicles or electric vehicles, for example.

Referring to FIG. 6, in some embodiments, the electronic device 60 may be transient liquid phase (TLP) bonded to the bonding surface 22 of the substrate 20. In such embodiments, the power electronics assembly 10 may include the bonding layer 50 disposed between the substrate 20 and the electronic device 60. In some embodiments, the thermal compensation layer 30 of the substrate 20 may be in direct contact with the bonding layer 50. The bonding layer 50 may have a melting temperature that is less than a melting temperature of the metal 33 of the MIO layer 31 of the thermal compensation layer 30. In some embodiments, the bonding layer 50 may have a melting temperature that is less than a TLP sintering temperature used to TLP bond the electronic device 60 to the substrate 20, and the metal 33 of the MIO layer 31 may have a melting temperature greater than the TLP sintering temperature. As a non-limiting example, the TLP sintering temperature may be between 280° C. and 350° C. In some embodiments, the bonding layer 50 may have a melting temperature less than 280° C., and the metal 33 of the MIO layer 31 may have a melting temperature greater than 350° C. For example, in some embodiments, the bonding layer 50 may be formed from tin (Sn) with a melting point of about 232° C., whereas the metal 33 of the MIO layer 31 may be copper (Cu), which has a melt temperature of 1085° C. In some embodiments, the bonding layer 50 may include a plurality of bonding layers. The bonding layer 50 may be applied to the bonding surface 22 of the substrate 20 or first surface 62 of the electronic device 60 by chemical vapor deposition, physical vapor deposition, electroplating, electroless plating, or film forming process. In some embodiments, the electronic device 60 may be directly bonded to the bonding surface 22 of the substrate 20 without a bonding layer disposed between them.

Referring to FIG. 1, the cooling surface 24 of the substrate 20 may be thermally coupled to the cooling structure 70. In some embodiments, the substrate 20 may be thermally coupled to the cooling structure 70 by a supplemental bonding layer (not shown), such as thermal grease or other thermally conductive bonding material. The cooling structure 70 may be a heat sink, heat exchanger, or other cooling structure. In some embodiments, the cooling structure 70 may include an air-cooled heat sink or a liquid-cooled heat sink, such as a jet impingement or channel-based heat sink device. In some embodiments, the substrate 20 may be directly bonded a surface of the cooling structure 70. The substrate 20 may be bonded to the cooling structure 70 using a variety of bonding techniques, such as but limited to TLP sintering, solder, brazing, or diffusion bonding, for example. In some embodiments, one or more thermally conductive interface layers may be positioned between the substrate 20 and the cooling structure 70.

Figure 9A:
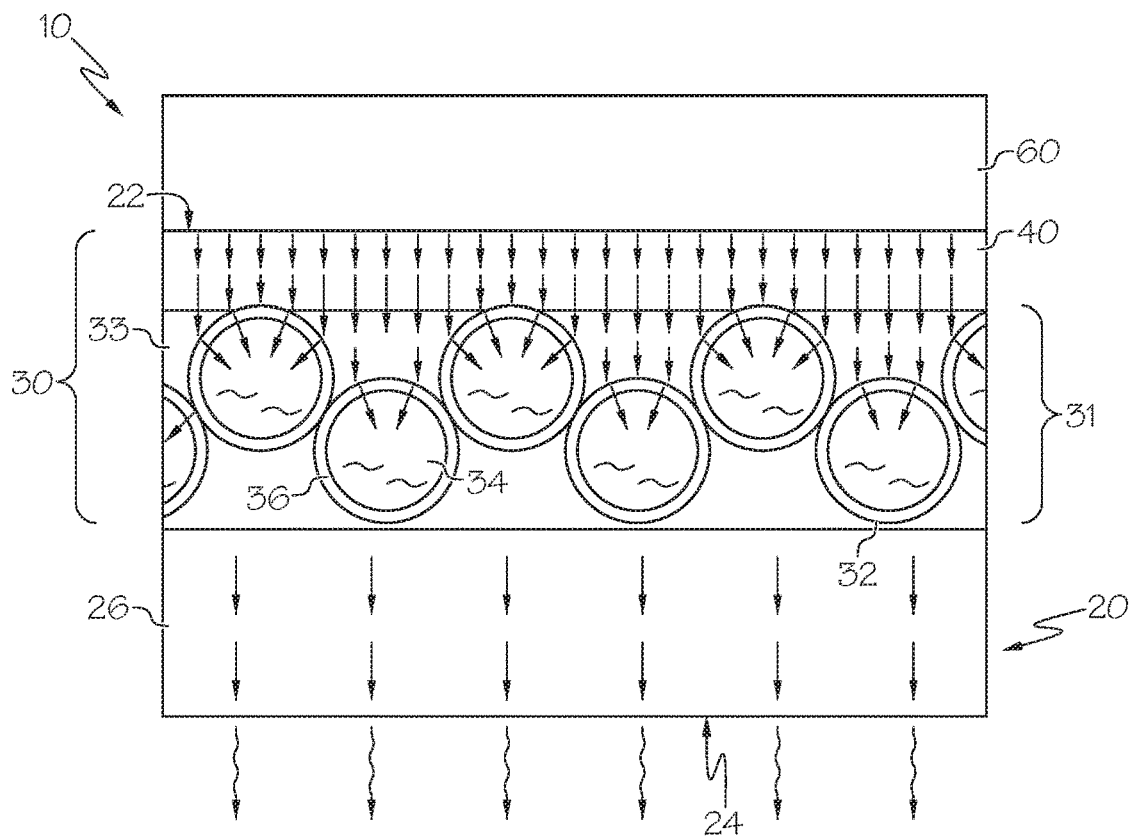
FIG. 9A schematically depicts a portion of the power electronics assembly of FIG. 1 during operation of the semiconductor device coupled to the substrate to generate heat, according to one or more embodiments shown and described herein.

Referring now to FIG. 9A, operation of the thermal compensation layer 30 will be described in further detail. During operation of the power electronics assembly 10, the electronic device 60 may generate heat. A portion of the heat generated by the electronic device 60 may be conducted down into the substrate 20 by the metal 33 of the MIO layer 31, in particular into the thermal compensation layer 30 as indicated by the arrows extending downward from the electronic device 60 in FIG. 9A. Other portions of the heat may be radiated outward from surfaces of the electronic device 60. Heat may be conducted through the metal 33 of the MIO layer 31 to the core-shell PC particles 32 embedded in the MIO layer 31. Initially, heat conducted to the core-shell PC particles 32 may increase the temperature of the core-shell PC particles 32 until the PCM in the core 34 reaches the PC temperature of the PCM, as shown in FIG. 4. As indicated by the spaced-apart arrows in FIG. 9A, a portion of the heat generated by the electronic device 60 may continue to be conducted through the core-shell PC particles 32 and the substrate 20 to the cooling surface 24 of the substrate 20, where heat may be removed from the substrate 20 by a cooling fluid or cooling structure.

Once the temperature of the PCM in the core 34 of the core-shell PC particle 32 reaches the PC temperature, the PCM may absorb additional heat generated by the electronic device 60, which may cause the PCM to change phase at constant temperature to a higher energy phase (e.g., liquid phase). For example, in some embodiments, the PCM may be tin or paraffin, and the heat input may cause the PCM to transition from a solid to a liquid at constant temperature. During the phase change, the PCM of the core-shell PC particle 32 may enable the substrate 20 with the thermal compensation layer 30 to absorb additional heat generated by the electronic device 60 without a further increase in the temperature. Thus, the core-shell PC particles 32 may increase the heat capacity of the thermal compensation layer 30. During the phase change of the PCM, the substrate 20 may continue to conduct heat from the core-shell PC particles 32 in the thermal compensation layer 30 to the cooling surface 24.

Figure 9B:
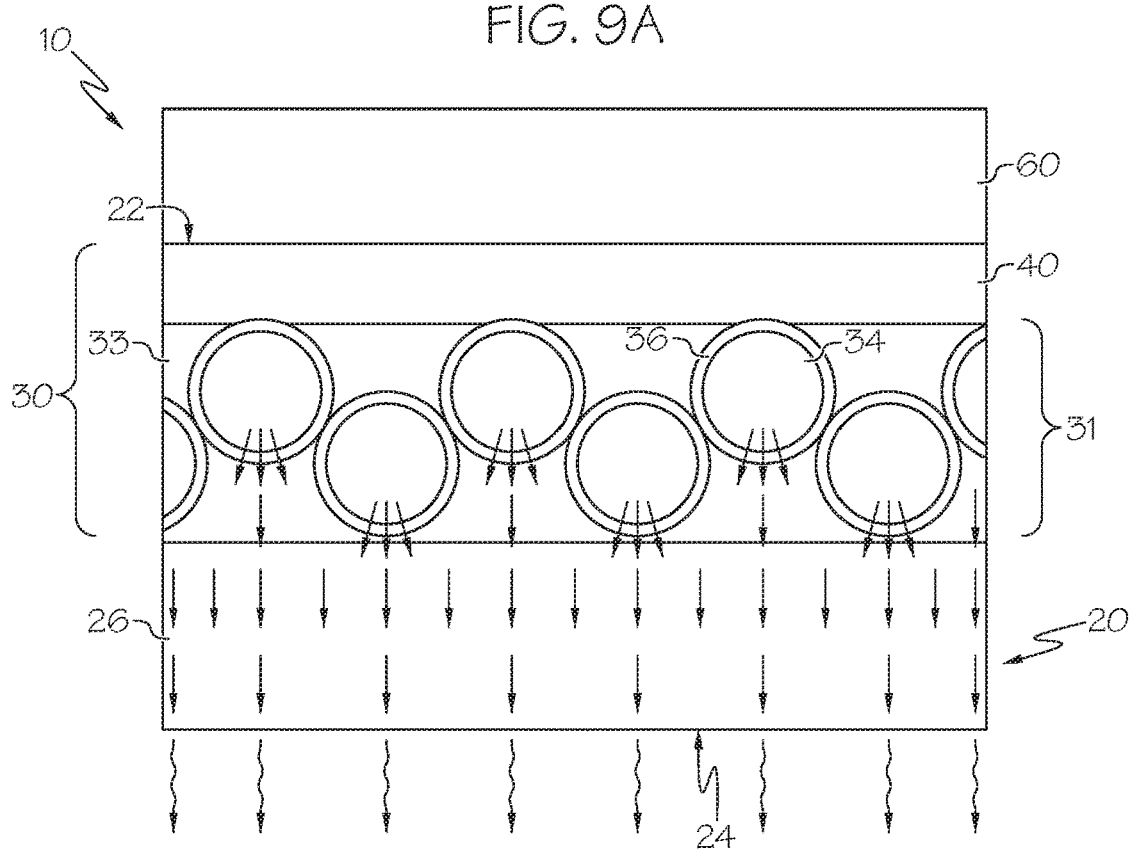
FIG. 9B schematically depicts the portion of the power electronics assembly of FIG. assembly 9A at a time when the semiconductor device coupled to the substrate is idle and heat stored in the PCM continues to be discharged by conduction through the substrate, according to one or more embodiments shown and described herein.

Referring now to FIG. 9B, when the electronic device 60 is in an idle state or reduced activity state in which less heat or no heat is generated, the substrate 20 may continue to conduct heat away from the core-shell PC particle 32 in the thermal compensation layer 30 as shown by the arrows in FIG. 9B. Continued heat conduction by the substrate 20 may remove heat from the core-shell PC particles 32, which may cause the PCM in the cores 34 of the core-shell PC particles 32 to change phase back into the lower energy phase (e.g., solid phase). For example, in embodiments in which the PCM is paraffin or a metal such as tin, the heat removal may transition the PCM from a liquid back into a solid. Thus, during periods of reduced load on the electronic device 60, the heat absorbed by the core-shell PC particles 32 may continue to be removed so that PCM in the cores 34 of the core-shell PC particles 32 can be reset to the lower energy phase (e.g., solid phase) in preparation for the next peak loading period of the electronic device 60.

Figure 10:
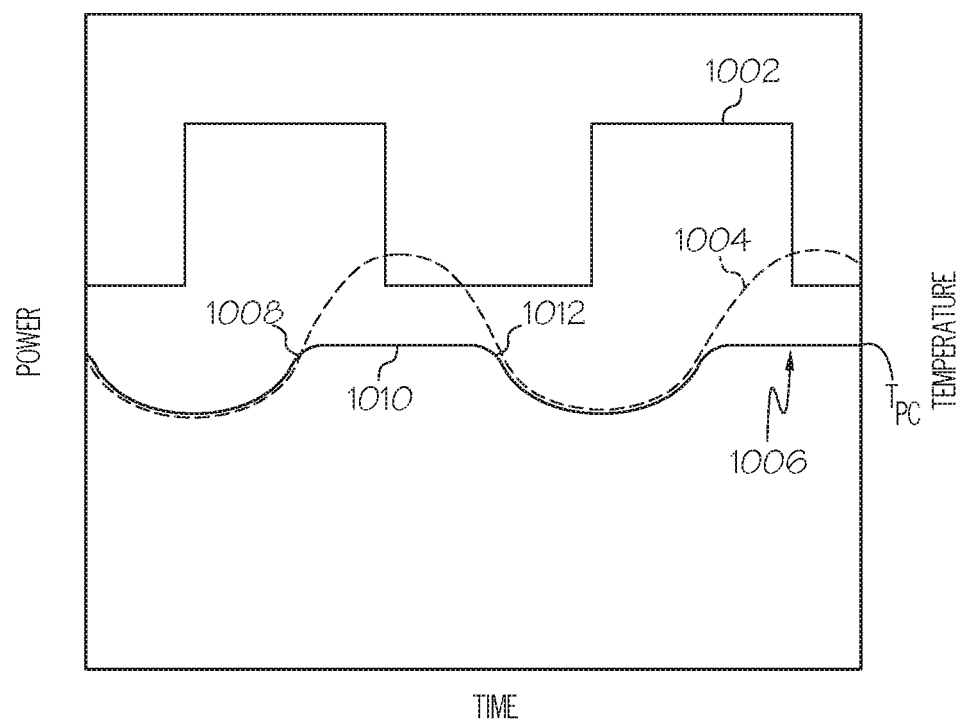
FIG. 10 graphically depicts a temperature of the PCM (right side y-axis) of the power electronics assembly of FIG. 1 as a function of time (x-axis) in response to a repeating step change in the power output of an electronics device of the power electronics assembly of FIG. 1, according to one or more embodiments shown and described herein.

Referring to FIG. 10, the thermal response (y-axis—right) of the thermal compensation layer 30 of the present disclosure (1006) as a function of time (x-axis) in response to an alternating step change in the power output of the electronics device 60 (1002) is depicted. As previously described, in response to a step change increase in power output, the temperature of the thermal compensation layer 30 increases until the temperature reaches the PC temperature of the core-shell PC particles 32 at point 1008. At point 1008, the temperature of the thermal compensation layer 30 may remain constant as the PC material of the core-shell-PC particles 32 change phase (i.e., region 1010 in FIG. 10). In FIG. 10, the power output is step changed back to a low power state before all of the PCM has changed phase to the higher energy phase (liquid). In response to the step change decrease in power output, the temperature of the thermal compensation layer 30 remains constant as the PCM of the core-shell PC particles 32 transforms back to the low energy phase (solid). Once all of the PCM is in the low energy phase (point 1012 in FIG. 10), the temperature of the thermal compensation layer 30 decreases until the power output is again increased. For comparison, the thermal response of a solid metal substrate 1004 is depicted. As shown in FIG. 10, the temperature of the solid metal substrate continues to increase until the power output is step changed back to the low power state. Thus, the thermal compensation layer 30 of the present disclosure (1006) may maintain a lower temperature compared to a solid metal substrate (1004)

Referring again to FIG. 6, a process for making a power electronics assembly 10 of the present disclosure may include producing the substrate 20 by forming the thermal compensation layer 30 on the substrate body 26 as previously described herein. The process for making the power electronics assembly 10 may further include bonding one or more electronic devices 60 to the bonding surface 22 of the substrate 20. As described herein, the electronic device 60 may be directly bonded to the bonding surface 22 or may be bonding to a bonding layer disposed between the substrate 20 and the electronic device 60. Direct bonding may include electroplating or electroless plating the electronic device 60 to the substrate 20. Bonding using a bonding layer may include TLP sintering or other bonding method described herein. In some embodiments, a cooling structure 70 may be bonded to the cooling surface 24 of the substrate, such as by direct bonding or bonding through another bonding layer.

Figure 11:
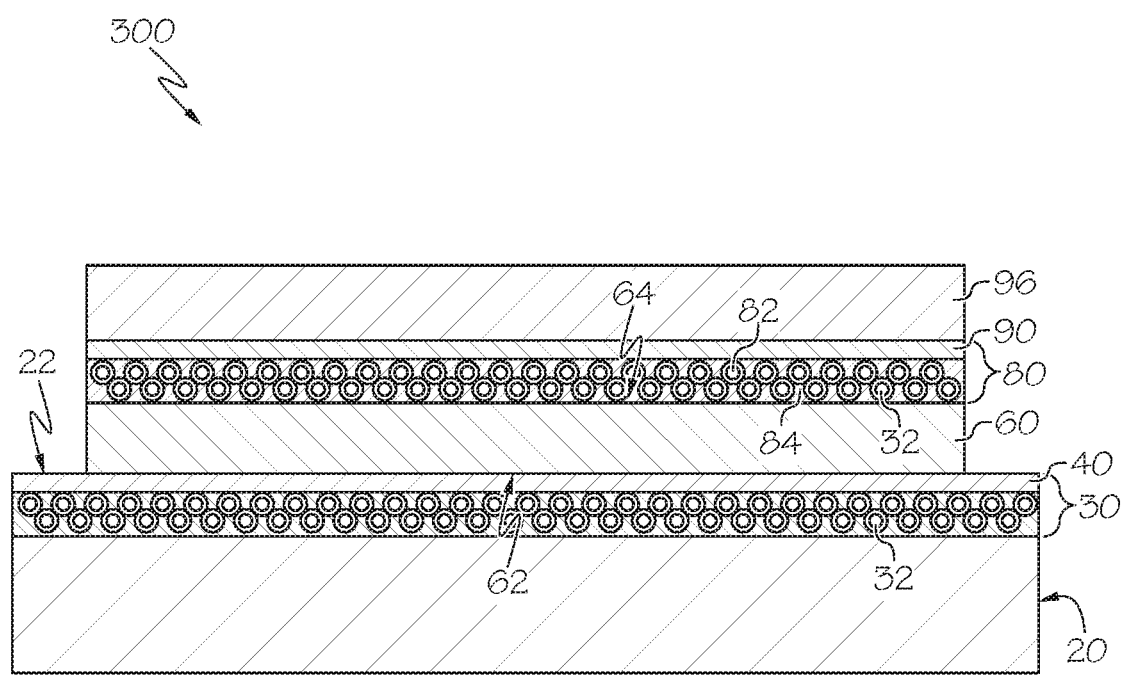
FIG. 11 schematically depicts yet another embodiment of a power electronics assembly, according to one or more embodiments shown and described herein.

The thermal compensation layer 30 disclosed herein may also be formed on one or more surfaces of the electronics device 60 or other structure of the power electronics assembly 10 to enable further heat removal from the electronics device 60. Referring to FIG. 11, in some embodiments, a power electronics assembly 300 may include a supplemental thermal compensation layer 80 bonded to a second surface 64 of the electronic device 60. The supplemental thermal compensation layer 80 may include a supplemental MIO layer 84 having a plurality of supplemental core-shell PC particles 82 encapsulated in a metal of the supplemental MIO layer 84. The supplemental thermal compensation layer 80 may enable further heat absorption from the electronic device 60 or other components of the power electronics assembly 300 disposed at the discrete locations 140 of the substrate 120.

The supplemental MIO layer 84 and supplemental core-shell PC particles 82 may have any of the characteristics and properties of the MIO layer 31 and core-shell PC particles 32 previously described herein. The supplemental core-shell PC particles 82 and supplemental MIO layer 84 may be the same or different than the core-shell PC particles 32 and MIO layer 31 with respect to PCM, shell material, average particle size of the core-shell PC particles, shape of the core-shell PC particles, metal of the MIO layer, or other property or characteristic. Although FIG. 11 shows the supplemental thermal compensation layer 80 formed on the second surface 64 of the electronic device 60, it is understood that the supplemental thermal compensation layer 80 can be formed on one or more other surfaces of the electronic device 60 (e.g., sides or bottom), one or more surfaces of a housing encompassing the power electronics assembly 300, or any other surface of the power electronics assembly 300.

Figure 12:
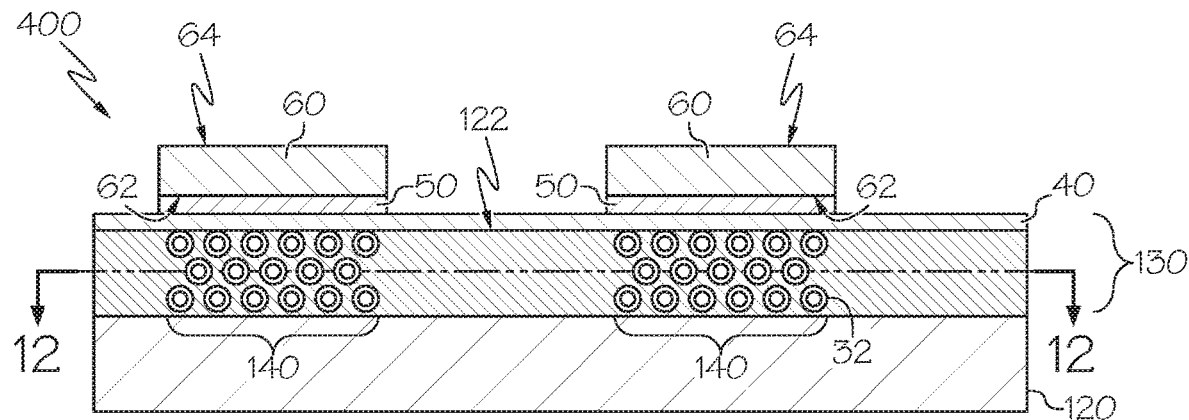
FIG. 12 schematically depicts yet another embodiment of a power electronics assembly in which a thermal compensation layer is disposed at discrete locations on the substrate, according to one or more embodiments shown and described herein.
Figure 13:
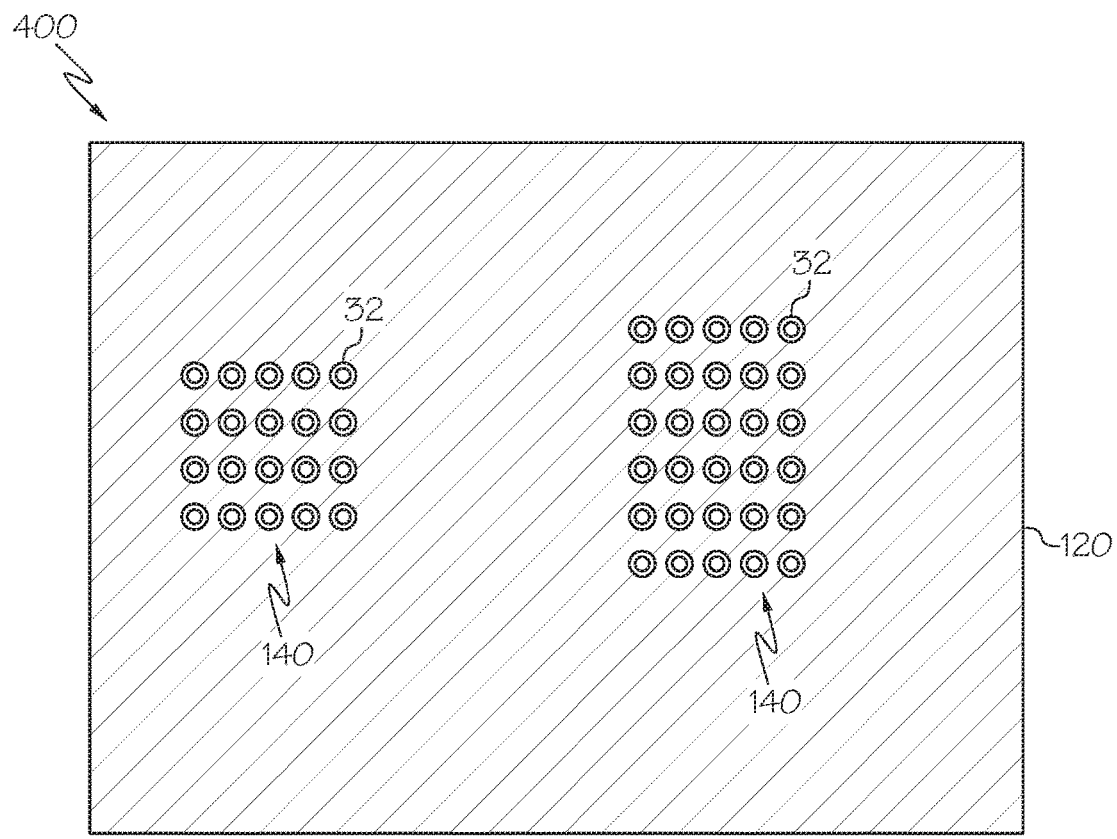
FIG. 13 schematically depicts a top view in cross-section of the power electronics assembly of FIG. 12 showing the discrete locations of the thermal compensation layer on the substrate, according to one or more embodiments shown and described herein.

Referring now to FIGS. 12 and 13, a power electronics assembly 400 is depicted in which the thermal compensation layer 130 may include the MIO layer and core-shell PC particles 32 disposed at discrete locations 140 of the bonding surface 122 of the substrate 120. In some power electronics assemblies 400, the substrate 120 may be larger than the electronic devices 60 so that multiple components can be bonded to the substrate 120. In these power electronics assemblies 400, the thermal compensation layer 130 may be disposed at discrete locations 140 of the substrate 120 to provide increased thermal stress compensation and heat capacity at these discrete locations 140. In some embodiments, the discrete locations 140 may correspond to locations at which one or more electronic devices 60 are bonded to the substrate 120. FIG. 13 schematically depicts a cross-section of the substrate 120 taken along reference line 12-12 in FIG. 12.

The thermal compensation layer 130 having the MIO layer and core-shell PC particles 32 disposed at a plurality of discrete locations 140 may be formed on the substrate 120 by depositing the core-shell PC particles 32 on the surface of the substrate body as previously described. In some embodiments, different core-shell PC particles 32 having different PCMs, size, shape, shell material, or other properties may be deposited at different discrete locations 140 on the surface of the substrate body. The core-shell PC particles 32 may optionally be sintered together. Once the core-shell PC particles 32 have been deposited on the surface of the substrate 120, the metal may be electroplated or electroless plated over the core-shell PC particles 32 to form the MIO layers 31 at the discrete locations 140 and then overgrown on top of the MIO layer 31 to form the cap layer 40. In some embodiments, the metal may also be electroplated or electroless plated over the surfaces of the substrate 120 that do not have the core-shell PC particles 32 deposited thereon, to produce regions of solid metal with no MIO layer and no core-shell PC particles 32. Thus, in some embodiments, the thermal compensation layer 130 may include the MIO layer having the core-shell PC particles 32 disposed at discrete locations 140 and a plurality of regions of solid metal disposed therebetween.

Figure 14:
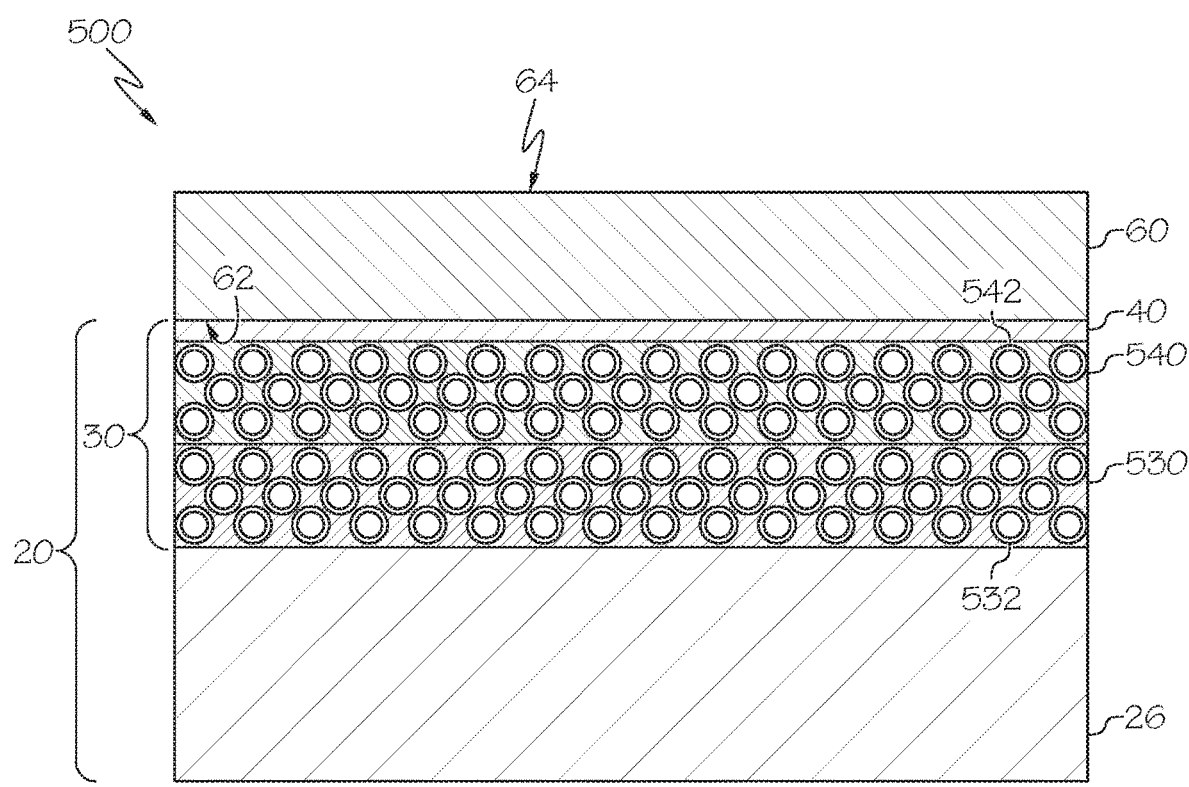
FIG. 14 schematically depicts another embodiment of a power electronics assembly in which the thermal compensation layer includes two MIO layers formed on a substrate to form a gradient in heat capacity through the thermal compensation layer, according to one or more embodiment shown and described herein.

As previously discussed, in some embodiments, the thermal compensation layer 30 may include a plurality of MIO layers, in which each of the plurality of MIO layers includes a plurality of core-shell PC particles comprising a PCM with a PC temperature different than the PC temperature of PCMs in the other of the plurality of MIO layers. Referring to FIG. 14, a power electronics assembly 500 is depicted in which the thermal compensation layer 30 may include a plurality of MIO layers. The thermal compensation layer 30 may include a first MIO layer 530 having first core-shell PC particles 532 with a first PCM in the core and a second MIO layer 540 coupled to a surface of the first MIO layer 530. In some embodiments, the cap layer 40 may be overgrown on top of the second MIO layer 540. In some embodiments, a layer of metal (not shown) may be deposited between the first MIO layer 530 and the second MIO layer 540. The second MIO layer 540 may include a plurality of second core-shell PC particles 542 having a second PCM in the core. The second PCM may be the same or different than the first PCM.

In some embodiments, the second PCM may have a PC temperature different than the PC temperature of the first PCM. In some embodiments, the thermal compensation layer 30 may include more than 2 MIO layers, such as 3, 4, 5, or more than 5 MIO layers. By including core-shell PC particles having different PCMs in each MIO layer (e.g., first MIO layer 530 and second MIO layer 540), a thermal compensation layer 30 having a gradient in heat capacity through the thickness of the thermal compensation layer 30 may be produced. The thickness of each MIO layer and properties of the core-shell PC particles in each MIO layer may be modified to fine tune the thermal response of the thermal compensation layer 30. In some embodiments, the average particle size of the core-shell PC particles may be different in each layer to produce graduations in the Young's modulus and thermal stress compensation response within the thermal compensation layer 30.

Figure 15:
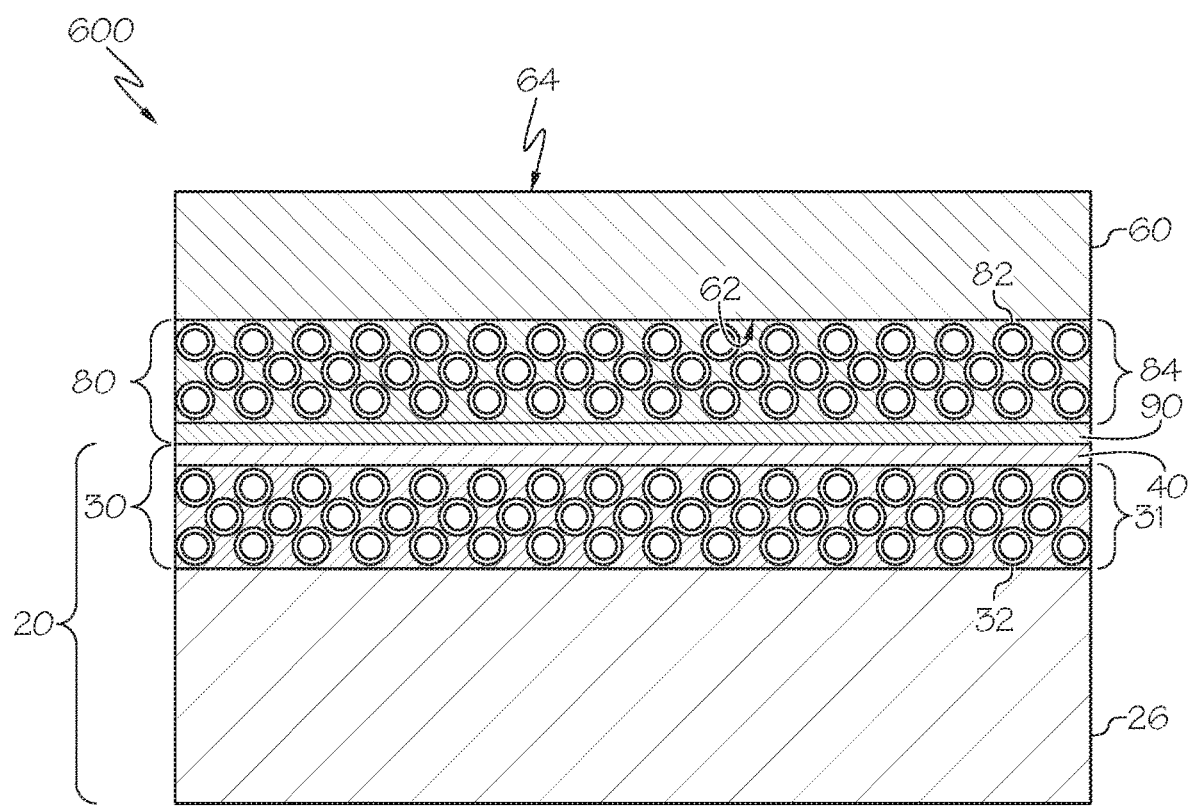
FIG. 15 schematically depicts yet another embodiment of a power electronics assembly electronics assembly in which one thermal compensation layer is formed on a substrate, another thermal compensation layer is formed on a surface of the electronic device, and the two thermal compensation layers are then bonded together, according to one or more embodiments shown and described herein.

Referring now to FIG. 15, in some embodiments, a portion of a power electronics assembly 600 having the thermal compensation layer 30 formed on the substrate 20 and the supplemental thermal compensation layer 80 formed on the first surface 62 of the electronics device 60 is depicted. The supplemental thermal compensation layer 80 may include the supplemental MIO layer 84 having a plurality of supplemental core-shell PC particles 82 encapsulated in a metal of the supplemental MIO layer 84. The supplemental MIO layer 84 and supplemental core-shell PC particles 82 may have any of the characteristics and properties of the MIO layer 31 and core-shell PC particles 32 previously described herein. The supplemental core-shell PC particles 82 and supplemental MIO layer 84 may be the same or different than the core-shell PC particles 32 and MIO layer 31 with respect to PCM, shell material, average particle size of the core-shell PC particles, shape of the core-shell PC particles, metal of the MIO layer, or other property or characteristic. The thermal compensation layer 30 may include the cap layer 40 overgrown onto the top surface of the MIO layer 31. In some embodiments, the supplemental thermal compensation layer 80 may include a supplemental cap layer 90 overgrown onto the surface of the supplemental MIO layer 84. In some embodiments, the supplemental cap layer 90 may be directly bonded to the cap layer 40 of the thermal compensation layer 30 to couple the electronics device 60 to the substrate 20. In other embodiments, the supplemental cap layer 90 may be coupled to the cap layer 40 by a bonding layer disposed between the supplemental cap layer 90 and the cap layer 40.

Figure 16:
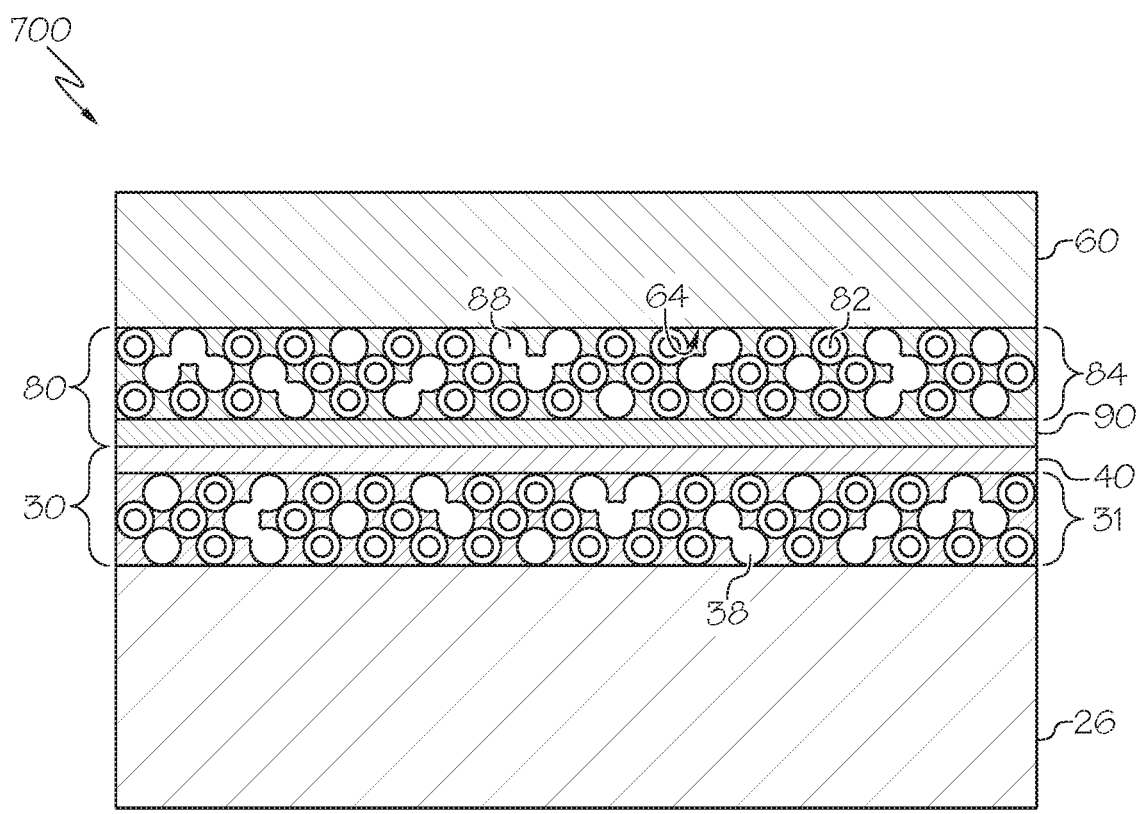
FIG. 16 schematically depicts the power electronics assembly of FIG. 15 in which each of the thermal compensation layers includes an MIO layer having a combination of core-shell PC particles and a plurality of hollow voids, according to one or more embodiments shown and described herein.

Referring now to FIG. 16, in some embodiments, the thermal compensation layer 30 may include a plurality of interconnected hollow spheres 38 interspersed with the core-shell PC particles 32, as previously described herein. Additionally or alternatively, in some embodiments, the supplemental thermal compensation layer 80 may include a plurality of interconnected hollow spheres 88 interspersed with the supplemental core-shell PC particles 82 in the supplemental MIO layer 84. The interconnected hollow spheres 88 of the supplemental MIO layer 84 may have any of the properties or characteristics of the interconnected hollow spheres 38 of the MIO layer 31. The size and number of the interconnected hollow spheres 88 in the supplemental MIO layer 80 may be the same or different than the size and number of the interconnected hollow spheres 38 in the MIO layer 31.

The substrates and power electronics assemblies described herein may be incorporated into an inverter circuit or system that converts direct current electrical power into alternating current electrical power and vice versa depending on the particular application. For example, in a hybrid electric vehicle application, several power electronics assemblies may be electrically coupled together to form a drive circuit that converts direct current electrical power provided by a bank of batteries into alternating electrical power that is used to drive an electric motor coupled to the wheels of a vehicle to propel the vehicle using electric power.

Power semiconductor devices utilized in such vehicular applications may generate a significant amount of heat during operation, which require bonds between the semiconductor devices and metal substrates that can withstand higher temperatures and thermally-induced stresses due to CTE mismatch. The thermal compensation layers described and illustrated herein may compensate for the thermally-induced stresses generated during thermal bonding of the semiconductor devices to the metal substrate and/or operation of the power semiconductor devices with a constant or graded stiffness across the thickness of the thermal compensation layers while also providing a compact package design. The thermal compensation layers described herein may also provide increased heat capacity, which may enable the thermal compensation layers to remove a greater amount of heat from electronics devices coupled thereto. In addition to vehicle applications, the power electronics assemblies having the thermal compensation layers disclosed herein may be used in various other electronic and power applications.

It is noted that the terms "about" and "generally" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A thermal compensation layer comprising:
    a metal inverse opal (MIO) layer that includes a plurality of core-shell phase change (PC) particles encapsulated within a metal of the MIO layer,
    wherein each of the core-shell PC particles comprises:
        a core comprising a phase change material (PCM) with a PC temperature in a range of from 100° C. to 250° C.; and
        a shell comprising a shell material having a melt temperature greater than the PC temperature of the PCM,
        wherein the PCM is tin or tin alloy.
2. The thermal compensation layer of claim 1, further comprising a cap layer overgrown onto the MIO layer.
3. The thermal compensation layer of claim 1, wherein the PCM comprises a paraffin or a metal.
4. The thermal compensation layer of claim 1, further comprising a bonding layer in contact with the MIO layer, wherein the shell material has a melt temperature greater than a sintering temperature of the bonding layer.
5. The thermal compensation layer of claim 1, wherein the shell material comprises a metal oxide or an electrically insulating polymer.
6. The thermal compensation layer of claim 1, wherein the metal of the MIO layer comprises copper, nickel, aluminum, silver, zinc, magnesium, or alloys thereof.
7. The thermal compensation layer of claim 1, wherein the MIO layer further comprises a plurality of hollow spheres that define a porosity of the MIO layer.
8. The thermal compensation layer of claim 1, comprising a plurality of MIO layers, wherein each of the plurality of MIO layers includes a plurality of core-shell PC particles, wherein the PC temperature of the PCM in each of the MIO layers is different than a PC temperature of at least one other PCM of another of the plurality of MIO layers.
9. The thermal compensation layer of claim 1, wherein the MIO layer is a first MIO layer having first core-shell PC particles with a first PCM in the core, and the thermal compensation layer further comprises a second MIO layer coupled to a surface of the first MIO layer, the second MIO layer comprising a plurality of second core-shell PC particles with a second PCM in the core, wherein the second PCM has a second PC temperature different than a first PC temperature of the first PCM.
10. A process for forming a thermal compensation layer, the process comprising:
    depositing a plurality of core-shell PC particles onto a surface of a substrate or an electronic device, the plurality of core-shell PC particles comprising:
        a core comprising a PCM with a PC temperature in a range of from 100° C. to 250° C.; and
        a shell comprising a shell material having a melt temperature greater than the PC temperature of the PCM, wherein the PCM is tin or tin alloy;
    depositing a metal over the plurality of core-shell PC particles to form an MIO layer; and overgrowing a cap layer on the MIO layer.
11. The process of claim 10, wherein the MIO layer is a first MIO layer having first core-shell PC particles with a first PCM and the process further comprises:
    depositing a plurality of second core-shell PC particles onto a surface of the first MIO layer, the second core-shell PC particles having a second PCM, wherein, a second PC temperature of the second PCM is different than a first PC temperature of the first PCM or an average particle size of the second core-shell PC particles is different than an average particles size of the first core-shell PC particles; and
    electroplating metal over the plurality of second core-shell PC particles to form a second MIO layer.
12. A power electronics assembly comprising:
    a substrate having a thermal compensation layer formed on an outer surface of the substrate, the thermal compensation layer comprising a metal inverse opal (MIO) layer and a cap layer on the MIO layer, the MIO layer including a plurality of core-shell phase change (PC) particles encapsulated within a metal of the MIO layer; and
    an electronic device bonded to the thermal compensation layer at a first surface of the electronic device;
    wherein each of the core-shell PC particles comprises:
        a core comprising a phase change material (PCM) with a PC temperature in a range of from 100° C. to 250° C.; and a shell comprising a shell material having a melt temperature greater than the PC temperature of the PCM.

13. The power electronics assembly of claim 12, further comprising a bonding layer disposed between the thermal compensation layer and the electronic device.

14. The power electronics assembly of claim 12, further comprising a supplemental thermal compensation layer bonded to the first surface or a second surface of the electronic device, the supplemental thermal compensation layer comprising a supplemental MIO layer having a plurality of supplemental core-shell PC particles encapsulated in a metal of the supplemental MIO layer.

15. The power electronics assembly of claim 12, comprising a plurality of electronic devices, wherein the MIO layer is disposed at discrete locations of the bonding surface of the substrate, the discrete locations corresponding to locations at which each of the plurality of electronic devices are bonded to the substrate.

16. The power electronics assembly of claim 12, wherein the MIO layer is a first MIO layer having first core-shell PC particles with a first PCM, and the thermal compensation layer further comprises a second MIO layer coupled to a surface of the first MIO layer, the second MIO layer comprising a plurality of second core-shell PC particles with a second PCM, wherein the second PCM has a PC temperature different than a PC temperature of the first PCM.

* * * * *